(12) United States Patent
Gaudreau et al.

(10) Patent No.: US 6,368,676 B1
(45) Date of Patent: Apr. 9, 2002

(54) METHOD OF COATING AN ARTICLE

(75) Inventors: Marcel P. J. Gaudreau, Lexington; Michael Kempkes, Westford; Timothy Hawkey, Lincoln, all of MA (US)

(73) Assignee: Diversified Technologies, Inc., Bedford, MA (US)

( * ) Notice: Subject to any disclaimer, the term of this patent is extended or adjusted under 35 U.S.C. 154(b) by 0 days.

(21) Appl. No.: 09/618,543

(22) Filed: Jul. 18, 2000

Related U.S. Application Data

(60) Provisional application No. 60/144,724, filed on Jul. 20, 1999.

(51) Int. Cl.[7] ............ C23C 14/06; C23C 14/48; H05H 1/24; A63B 53/04
(52) U.S. Cl. ............ 427/523; 427/530; 427/569; 427/577; 473/282
(58) Field of Search ................ 427/523, 530, 427/569, 577; 473/290, 282

(56) References Cited

U.S. PATENT DOCUMENTS

| | | | | |
|---|---|---|---|---|
| 4,869,923 A | * | 9/1989 | Yamazaki | 427/577 |
| 5,277,939 A | * | 1/1994 | Yamazaki | 427/569 |
| 5,330,800 A | * | 7/1994 | Schumacher et al. | 427/523 |
| 5,340,618 A | * | 8/1994 | Tanisaki et al. | 427/569 |
| 5,366,764 A | * | 11/1994 | Sunthankar | 427/569 |
| 5,442,185 A | * | 8/1995 | Chan | 250/492.21 |
| 5,480,052 A | * | 1/1996 | Furr et al. | 427/569 |
| 5,509,933 A | * | 4/1996 | Davidson et al. | 623/16 |
| 5,677,051 A | * | 10/1997 | Ueda et al. | 427/577 |
| 6,088,947 A | * | 7/2000 | Suzue et al. | 473/319 |
| 6,171,821 B1 | * | 1/2001 | Weber et al. | 427/577 |
| 6,290,821 B1 | * | 9/2001 | McLeod | 204/192.12 |

FOREIGN PATENT DOCUMENTS

| | | | |
|---|---|---|---|
| EP | 0302717 A1 | * | 2/1989 |
| GB | 2114963 A | * | 9/1983 |
| JP | 410064696 A | * | 3/1998 |

\* cited by examiner

*Primary Examiner*—Marianne Padgett
(74) *Attorney, Agent, or Firm*—Iandiorio & Teska

(57) ABSTRACT

A method of coating an article wherein the method includes placing a large number N of non-industrial stock pieces in a vacuum chamber where N is a function of the cost of each stock piece, generating a plasma about the stock pieces, and supplying a current to the stock pieces at a level tailored to sufficiently coat each of the plurality of stock pieces with ion from the plasma and wherein the current level depends on the number N of stock pieces.

6 Claims, 4 Drawing Sheets

METHOD OF COATING AN ARTICLE

RELATED APPLICATIONS

This application claims priority based on U.S. Provisional Application, Ser. No. 60/144,724 filed Jul. 20, 1999.

FIELD OF THE INVENTION

This invention generally relates to the field of sporting goods including golf clubs and in particular golf club heads. The invention relates to using plasma immersion ion implantation (PIII) and/or plasma immersion ion deposition processes to produce a hard, diamond-like coating on an article to increase the surface hardness, durability, and corrosion resistance of the article.

BACKGROUND OF INVENTION

The market for sporting goods in the U.S. (and the world) has grown significantly over the past ten years. For example, over 20 million Americans play recreational golf each year, and increasing numbers of these golfers are willing to pay large sums of money for golf equipment utilizing new technologies that offer performance advantages. Consequently, designers of sporting equipment such as golf clubs continually seek to optimize their design and construction, including innovative selection of club head and shaft materials, to achieve maximum performance. Along with improvements that increase the distance that a ball will be propelled after being struck, two other leading issues that golf club designers have attempted to address include durability and directional accuracy.

Traditional clubs having heads made of hard wood (which tend to warp or split and are often costly) have given way to the development of heads made of engineered materials, such as steels, cast irons, aluminum, copper, titanium, graphite, plastics, carbides, and the like. In addition, because Young's Modulus (which expresses the rigidity of a material) teaches that the greater the rigidity of a material, the greater will be the distance traveled by the ball, some designers have coated these engineered materials with other materials in an attempt to increase the hardness of the striking surface. However, as discussed in U.S. Pat. No. 5,851,158 to Winrow et al. (which is incorporated herein by this reference), many of these coating methods have poor bond strength and chip during normal use of the golf clubs. Moreover, current methods of applying these coatings result in coatings that are too thin to provide sufficient wear resistance.

Some designers have suggested using diamond, the material with the highest known Young's Modulus, as a coating material for golf clubs. For example, U.S. Pat. No. 4,951,953 to Kim, (hereinafter "Kim") which is incorporated herein by reference, describes applying a coating about 0.5 mil to 5 mil thick containing at least 10% of a material having a Young's Modulus of 50 million pounds per square inch (psi) to golf club heads. Kim indicates that diamond, which has Young's Modulus of 130–170 million psi, is the preferred material. However, Kim states that economic and technical limitations (then in existence) prevent applying a coating of pure diamond on a golf club. Instead, Kim teaches coating golf clubs with an electroless composite material where diamond particles are embedded in a metal or metal alloy matrix such that the diamond particles are weakly cemented together by the soft metal without any diamond-diamond bonds.

Other golf club designers have recognized the desirability of using pure diamond at the striking surface of a golf club, but have not coated the entire golf club or golf club head with diamond. For example, U.S. Pat. No. 5,620,382 to Cho et al. (which is incorporated herein by reference) teaches providing a golf club with a ball striking face that has an insert made of a material, such as polycrystalline diamond (PCD), where the individual crystals are bonded together by diamond-diamond bonds. The insert typically is located in the "sweet spot" of the club face, thus the remainder of the club face does not necessarily benefit from the scratch and chip resistant diamond insert. Moreover, the diamond insert substantially increases the expense and complexity of manufacturing the golf club.

In recent years, new processes have been developed that can selectively alter the structure and physiochemical properties of the surfaces of materials such as metals, plastics, glass, and ceramics. Such advanced processes for metal treatment and hardening represent a multi-billion dollar business in the U.S. One of the most promising of these processes is plasma immersion ion implantation (PIII) (also referred to as Plasma Source Ion Implantation (PSII)), described herein, in which metal surfaces can be conformally implanted with a flux of high energy ions with minimal distortion or surface heating. Another such process described herein is called plasma immersion ion deposition, in which a thin, hard coat of a substance is applied to an irregular surface. However, the industrial application to date of PIII and plasma immersion ion deposition has been limited to laboratory environments and to a few experimental large-scale processes. Practical commercial implementations of these technologies are hindered by the lack of automated, commercially usable manufacturing processes and systems capable of simultaneously providing high voltage pulsed power, vacuum pumping, and plasma generation. To date, no art appears to teach coating golf club heads using plasma immersion processes.

BRIEF SUMMARY OF THE INVENTION

Accordingly, it is one objective of the present invention to provide a commercial scale PIII system capable of performing the PIII process and/or the plasma immersion ion deposition process in an automated fashion.

It is further an objective of the present invention to provide a system and method for treating a workpiece, which can comprise one or more articles to be hardened, with the PIII process where the system comprises a chamber under a vacuum, in which the workpiece is placed; a plasma generator for generating plasma from a gas fed into the chamber such that the plasma immerses the workpiece; and a high voltage pulser for pulsing the workpiece at high negative voltages, thereby accelerating the ions in the plasma normal to the surface of the workpiece, whereby the entire surface of the workpiece is implanted with a flux of energetic plasma ions without mechanical manipulation, as would be required for conventional beam-line implantation.

It is yet another object of the invention to optimize the system and method for performing the PIII process. In one embodiment, the plasma generating mechanism generates plasma using any of a number of known plasma generation methods, such as RF powered inductive coupling that is pulsed in timed synchronization with the high voltage pulses that are generated at the high voltage pulser, to minimize the average power required by the system. In another embodiment, the vacuum for the chamber is provided by a vacuum pump system comprising diffusion pumps, a cryogenic cold trap to prevent back streaming of the oil in the diffusion pumps, and a pump control system that optimizes the gas throughput and pump speed to reduce the cycle time needed to perform the PIII process.

It is another objective of the present invention to provide a workpiece having improved durability, scratch resistance and accuracy. In one embodiment, the workpiece comprises one or more golf clubs each comprising a head and a shaft, wherein at least a portion of the golf club is treated with the PIII process to produce a hardened golf club. The material used to treat the surface of the one or more golf clubs preferably has a high Young's Modulus and a relatively low weight density to minimize the weight added to the one or more golf clubs. In one embodiment, diamond or a diamond-like-carbon (DLC) is used to treat the one or more golf clubs. In another embodiment, only a portion of the head of the one or more golf clubs is treated with the PIII process. In yet another embodiment, the entire golf club head is treated with the PIII process.

This invention results from three interrelated realizations: (1) That line of site ion implantation methods can not be used to coat relatively inexpensive and irregularly shaped non-industrial articles such as golf club heads because of the special fixturing required; 2) that coating such articles using time consuming ion immersion techniques is only cost effective if a large number of articles are coated at once; and 3) that the current level applied to the articles must be tailored depending on the number articles to properly coat each article.

Thus, in this invention, the number of articles coated at once is a function of the cost of each article and the peak current level or power level used to coat the articles is a function of the number of articles. In this way, hundreds and even thousands of golf club heads or other sporting good articles can be coated by the plasma vapor deposition, plasma immersion implantation, or plasma immersion ion processing methods without adversely increasing the cost of the golf club heads and yet at the same time resulting in extremely durable and scratch resistant golf club heads.

Other objects and advantages of the present invention will become apparent from the following detailed description when viewed in conjunction with the accompanying drawings, which set forth certain embodiments of the invention.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENTS

Ion implantation is an advanced process that provides a unique means for developing surface layers with novel compositions and microstructures that are otherwise difficult or impossible to obtain. In conventional ion implantation, a beam of energetic ions extracted from a plasma source is accelerated toward the surface to be implanted. The ions impinging on the solid surface at high energy become buried at depths typically in the range of 0.01 to 1 microns, resulting in the modification of the atomic composition and lattice structure of the near-surface region without affecting the surface roughness, dimensional tolerances, and bulk material properties, as in the case of other high-temperature vacuum coating techniques.

Metallurgical reactions that occur with ion implantation, such as a solid solution of implant element, generation of dislocations and point defects, alteration of crystallinity (amorphization), precipitation of second phases and compound formation, and changes in the chemical composition and stress-strain state, can produce a significant hardening and strengthening effect on a thin surface layer which, in turn, may greatly enhance the fatigue life, oxidation resistance, and tribological properties, such as friction and wear, of a wide range of base materials used in various industrial and medical prostheses applications. However, because conventional ion implantation is a line-of-sight operation, special fixturing is needed to provide the beam rastering and component manipulation that ensure spatial uniformity in treatment. In addition, heat sinks and masking often are required to prevent excessive heating and sputtering of the component being implanted. Thus, line of sight implantation is complicated, expensive, and not completely effective.

Figure 1:
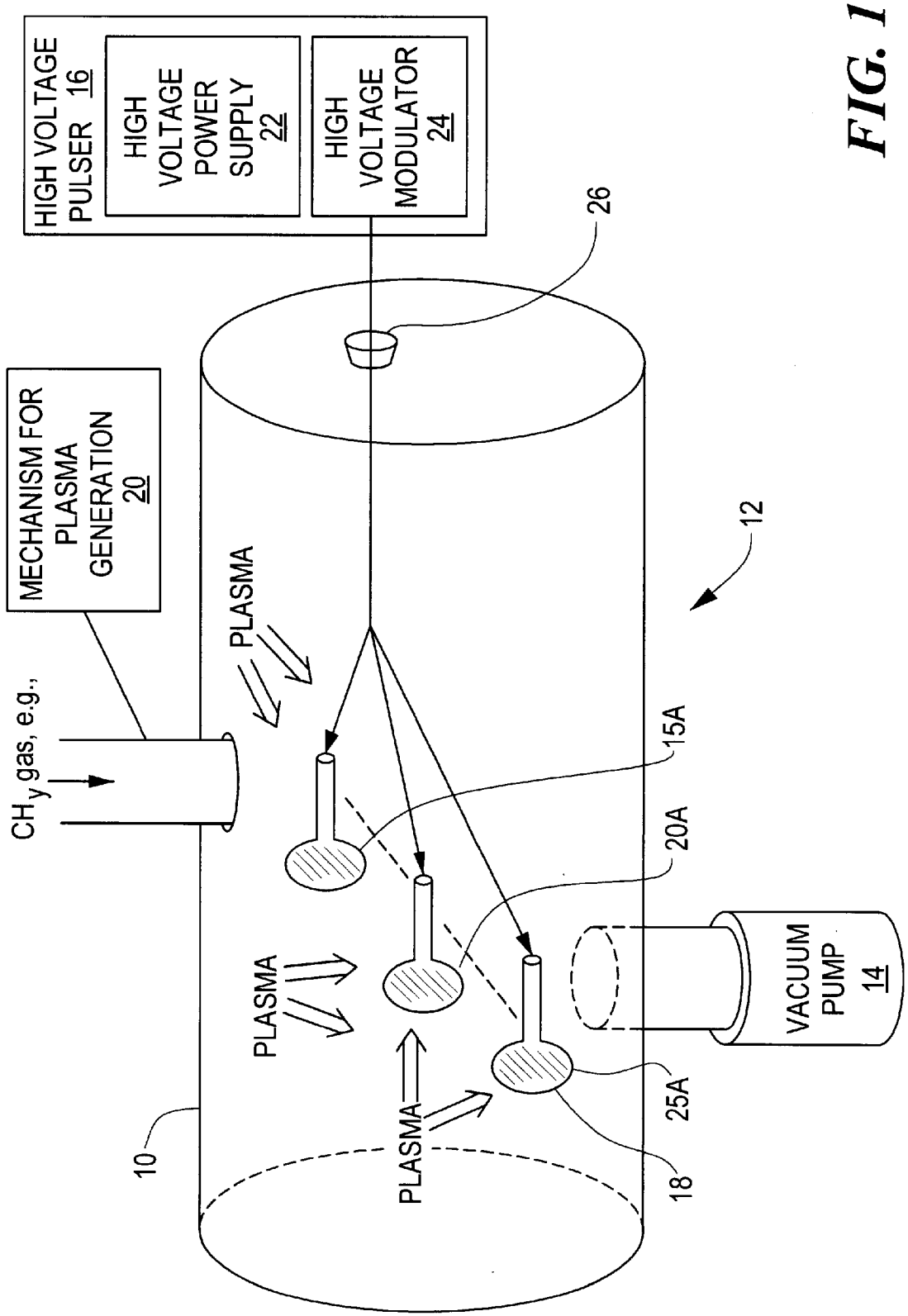
FIG. 1 is an illustration of a system for manufacturing a hardened workpiece, in accordance with one embodiment of the invention.

One solution to the above implantation problem is called plasma immersion implantation (PIII). Because PIII is a non-line of sight implantation technique, it can circumvent many of the drawbacks of conventional ion implantation. FIG. 1 illustrates a system 12 for implanting ions on the surface of a workpiece 18 comprising one or more articles to be hardened, in accordance with one embodiment of the invention. In FIG. 1, the workpiece is shown, for illustrative purposes only, as a plurality of golf clubs. In one embodiment, each article comprises an entire golf club, and in another embodiment, each article comprises a golf club head only. It is anticipated that the proposed invention will provide the greatest advantage in the hardening of the golf club head. By hardening, the present invention refers to any combination of one or more of the processes described herein (i.e., PIII alone, PIII plus plasma immersion ion deposition, and plasma immersion ion deposition alone) as used to harden one or more articles.

The system of FIG. 1 may be used, in other embodiments of the invention, for hardening the surfaces of other types of sporting goods and other items that are made of materials capable of being implanted, such as tennis rackets, hunting knives, fishing poles, skis, snowboards, and the like. It should also be understood that many techniques for strengthening the surface of materials, such as implantation only, implantation and deposition and deposition-only (which are described herein) are usable with the system 12 of FIG. 1.

Referring to FIG. 1, in the present invention, during plasma immersion ion implantation, the workpiece 18 to be implanted (such as one or more golf clubs) is put in a vacuum chamber 10. The overall size of chamber 10 will, in one embodiment of the invention, be dependent on the size of the workpiece, such as, for example, the number of articles comprising the workpiece 18 to be implanted. It is currently believed that a chamber 10 having minimum dimensions of 6 feet in diameter and 10 feet long is required to process economically a large workpiece 18, including a workpiece 18 comprising large numbers of smaller articles. The invention can be practiced with a wide variety of chamber sizes.

Although not specifically illustrated in FIG. 1, the chamber 10 must provide electrical isolation of the workpiece 18 up to 100 kV during pulsed operation of the high voltage pulsar 16 (the power levels for the PIII process). Thus, the chamber 10, feedthrough 26, and workpiece fixture (not shown) each have proper insulation. The wall thickness of the chamber 10 is, in one embodiment, dependent on the pressure and x-ray requirements of the system. For example, in one embodiment, the chamber 10 comprises one-inch thick steel instead of a conventional thin shell of steel with lead shielding.

Although not illustrated in FIG. 1, in another embodiment of the invention, the system also provides for cleaning the surface of the materials to be implanted. For example, in one embodiment, an inert gas such as argon is used to remove molecules of contaminants from the surface of the workpiece 18. The cleaning may be accomplished using sputtering or other known techniques. Argon ions can sputter clean the surfaces of the inductive plasma sources and minimize the deposition of a conductive carbon coating. For example, in one embodiment, effective operation of inductive sources (e.g., for plasma generation) relies on generated magnetic and RF fields penetrating through the volume of the chamber 10. Conductive carbon coatings in such ion implementation are undesirable because they can absorb RF fields and prevent inductive plasma generation. Argon ions also are useful because they provide ion assisted mixing and energy transfer to surface neutral carbon atoms. Those skilled in the art will appreciate that other cleaning methods are usable.

The system 12 of FIG. 1 further comprises, in one embodiment, a fixture (not shown) adapted to hold the workpiece 18 during the hardening process. In another embodiment, the fixture is structured and arranged to further provide cooling to the workpiece 18 being hardened. For example, in one embodiment, the workpiece 12 may comprise one or more golf club heads, such that the head of a golf club is positioned on a fixture capable of providing liquid cooling to the inside of the club head. In this embodiment, the liquid is arranged to flow out of the chamber after circulating through the head of the golf club, to remove heat from the golf club. Those skilled in the art will recognize other cooling techniques are usable with various workpieces within the spirit and scope of the invention.

As noted above, chamber 10 is under a vacuum. As illustrated in FIG. 1, a vacuum pump 14 may be used to create the vacuum. In one embodiment, the vacuum pump system uses appropriately designed diffusion pumps that can pump large volumes at relatively low cost and with low maintenance. However, diffusion pumps use oil vapor convection to produce their pumping action, so in some embodiments of the invention (not shown) the vacuum pump further comprises a cold trap, such as a cryogenic cold trap. In still other embodiments, the vacuum pump 14 includes a blower backer pump system. In still another embodiment, the multiple considerations of high gas throughput, pump speed, operating cost, initial cost, and maintenance are relevant design criteria are optimized to produce a system with adequate commercial performance (e.g., a fast cycle time).

Referring again to FIG. 1, after the workpiece 18 is placed in the chamber 10, a gas, such as nitrogen or methane ($CH_4$) (for carbon) enters the chamber 10. The examples of nitrogen and methane gas should not be taken as limiting. Many different gases are usable with the invention, and those skilled in the art will recognize that the particular gas selected will depend on the particular ion that is to be implanted. For example, many different hydrocarbons may be used for implantation of carbon. Referring again to FIG. 1, the gas is ionized (i.e., the electrons are stripped from the gas molecules) into a plasma so that the workpiece 18 is immersed in the plasma. Plasma may be generated capacitively, inductively, or by thermal emission. Typically, inductive plasma coupling is used to generate large amounts of plasma.

For large-scale systems, such as that illustrated in FIG. 1, however, the amount of RF power required is large. This is overcome, in one embodiment, by pulsing the RF power in timed synchronization with the high voltage pulses (generated at the high voltage pulsar 16), which minimizes the average power required. In the embodiment of FIG. 1, the high voltage pulser 16 further comprises a high voltage power supply 22 and a high voltage modulator 24. In another embodiment, a solid state modulator, such as those manufactured by Diversified Technologies of Bedford, Mass., is used as the high voltage modulator 24 to simultaneously provide the power for both ionization and the pulsed high negative voltage. The high voltage levels are delivered to the workpiece 18 (or to the fixture (not shown) holding the workpiece 18) via the high voltage feedthrough 26.

Referring again to FIG. 1, the workpiece 18 is then repetitively pulsed at high negative voltages (in the 0.5 kV–100 kV range), using, for example, the high voltage pulsar 16, to implant the surface of the workpiece 18 with a flux of energetic plasma ions. Because the plasma surrounds the workpiece 18, and because the ions are accelerated normal to its surface, plasma ion implantation occurs over the entire surface, thereby eliminating the need to manipulate the workpiece 18 (or any other non-planar component) in front of an ion beam. This PIII technique thus circumvents the line-of-sight restrictions inherent in conventional ion implantation. Therefore, parts with complex geometry, such as golf clubs, can be implanted without elaborate target manipulation arrangements.

The system 12 of FIG. 1 may further be used for an additional type of workpiece hardening, a type that is useful both in combination with the ion implantation described above and on its own. This additional hardening technique, called plasma vapor deposition or plasma immersion ion deposition, is useful because it is capable of applying a thin, hard coat of a substance to an irregularly surfaced workpiece, such as a plurality of golf clubs, using relatively low voltages of 0.5 kV to 5 kV. One type of plasma vapor deposition usable with the invention is described in Deok et al., *Diamondlike Carbon Deposition on Silicon Using RF Inductive Plasma of AR and $C_2H_2$ mixture in Plasma Immersion Ion Deposition*, Los Alamos National Laboratory, LA-UR-98-1930.

Figure 2:
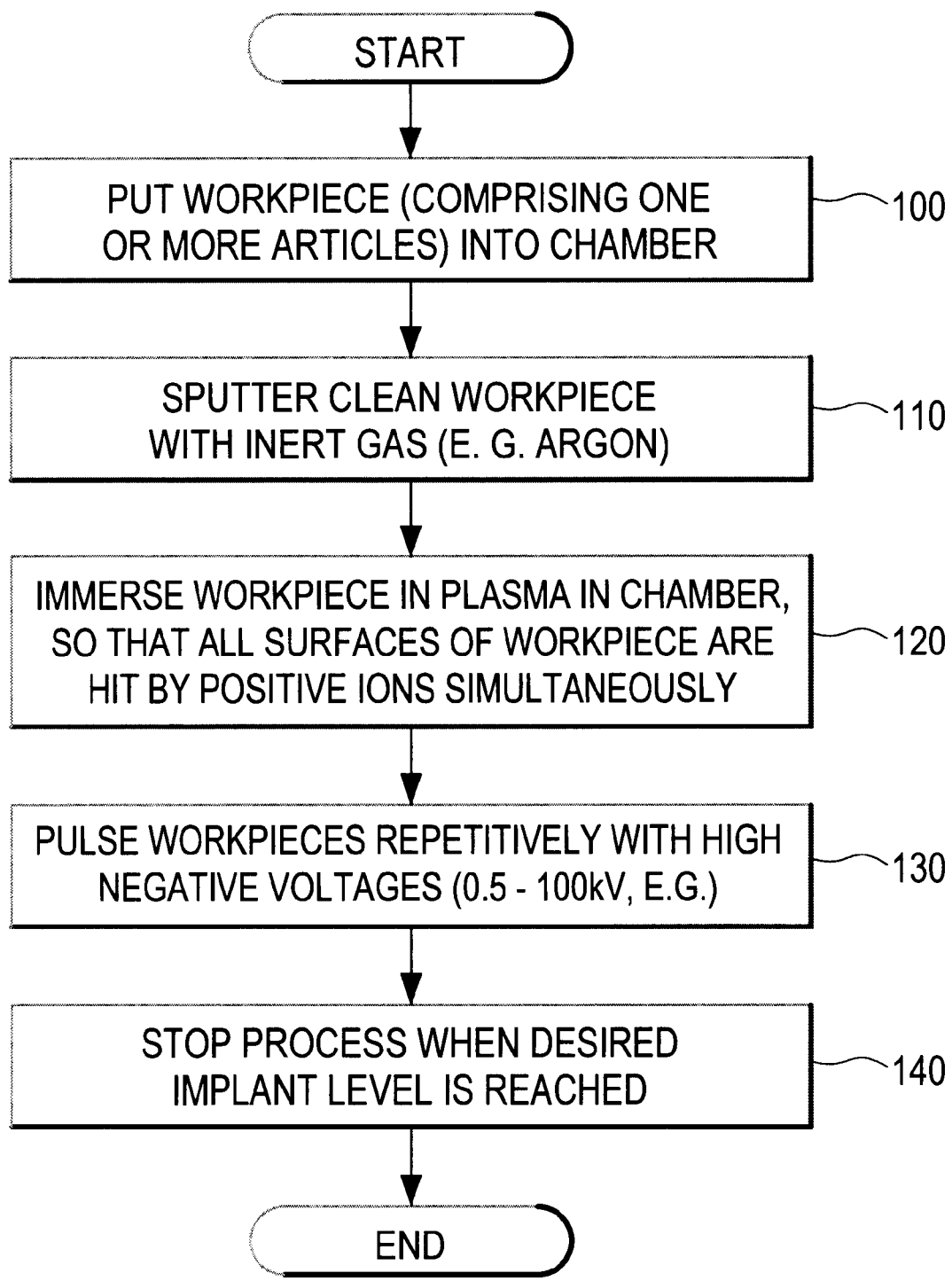
FIG. 2 is a flow chart of a method for hardening a workpiece using the system of FIG. 1, in accordance with one embodiment of the invention.

FIG. 2 is a flow chart of one embodiment of a process for hardening a workpiece using the system illustrated in FIG. 1. After the workpiece is placed in the chamber (step 100), it is sputter cleaned with argon (step 110) as described above. Then, a gas that is to be ionized, such as $CH_4$, is flowed into the chamber and ionized into plasma as it enters the chamber, thereby immersing the workpiece in the plasma (step 120), so that positive ions of the plasma hit all the surfaces of the golf club substantially simultaneously. Then, the workpiece is pulsed repetitively with high negative voltages (step 130), which causes the surface of the workpiece to be implanted with a flux of energetic plasma ions. This process continues until the desired level of implantation is reached (step 140). This process may be supplemented and/or replaced by deposition of ions into the implanted surface coating, as described below in connection with FIGS. 3 and 4.

Figure 3:
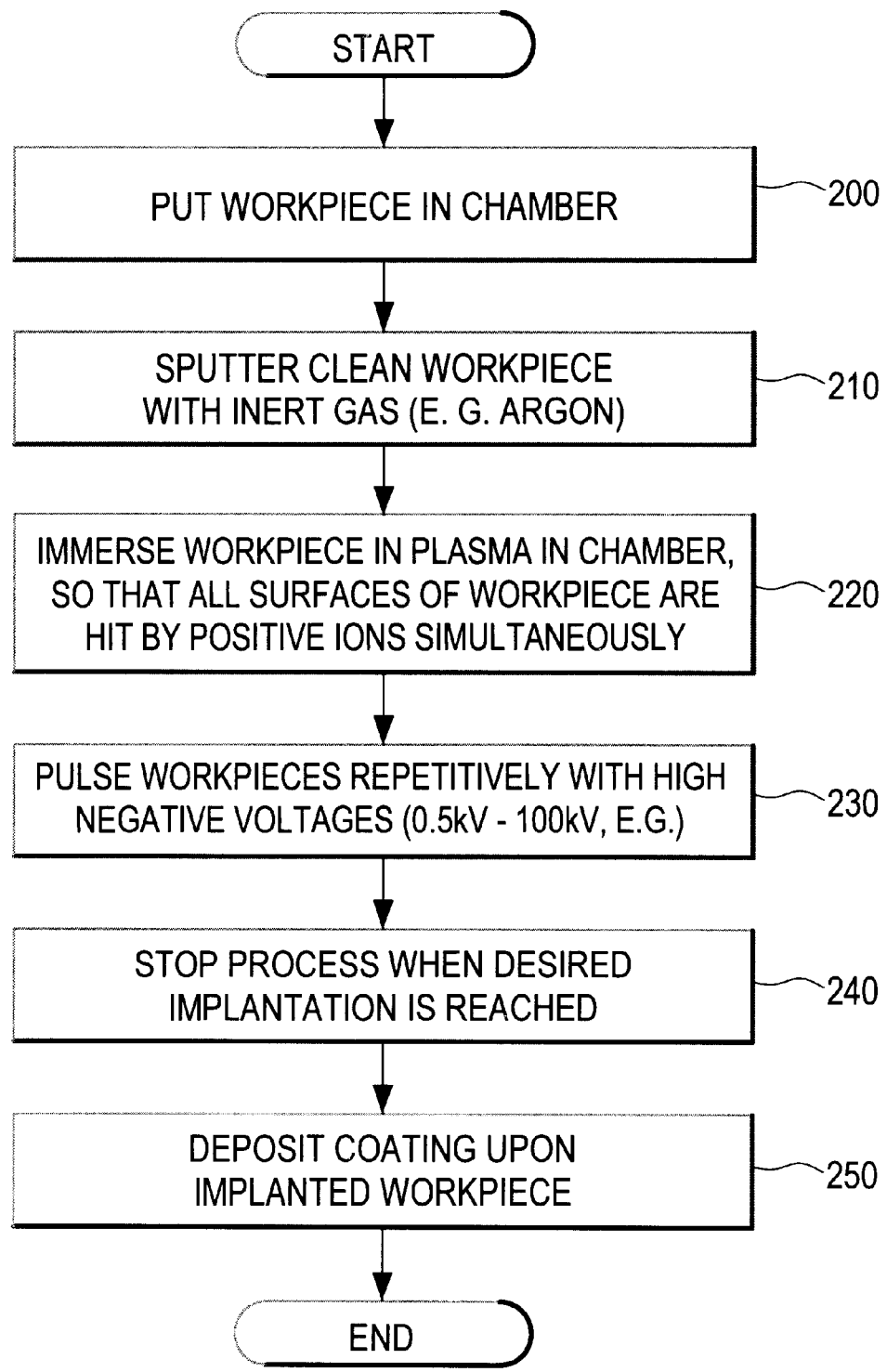
FIG. 3 is a flow chart of another method for hardening a workpiece, in accordance with another embodiment of the invention.

FIG. 3 is a flow chart of a process for manufacturing a hardened workpiece using both implantation and deposition, in accordance with one embodiment of the invention. Steps 200 through 230 are substantially similar to steps 100 through 130 of FIG. 1. However, after the implantation of Step 230 is complete, a coating of plasma ions, for example carbon ions, is applied, typically in a series of layers, to further harden the workpiece. Although not illustrated in FIG. 3, a cleaning step using, for example, argon, may occur after the implantation is complete (step 240) and before deposition begins (step 250). The deposition of step 250 can comprise one more layers of material, including alternating layers of different materials, alternating layers of the same material having different properties (e.g., hard-soft-hard, etc.), and the like. Typically, the selection of a material to be deposited will depend on the material being coated. As those skilled in the art recognize, certain materials have better adhesion properties over other materials.

Figure 4:
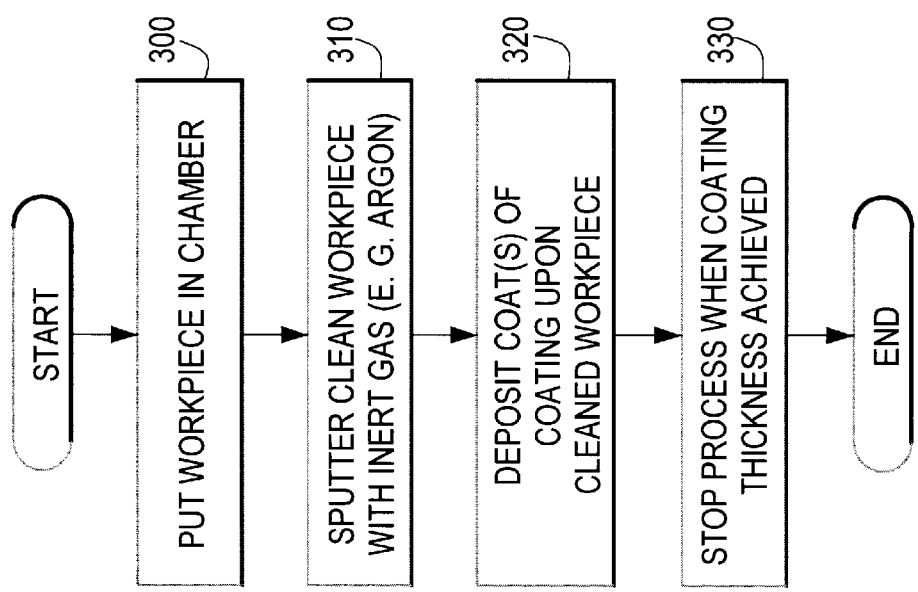
FIG. 4 is a flow chart of still another method for hardening a workpiece, in accordance with another embodiment of the invention.

FIG. 4 is a flow chart of yet another process for hardening a workpiece in accordance with the invention. In FIG. 4, after cleaning (step 310), the workpiece is hardened using deposition only (steps 320 and 330).

The processes of the present invention have numerous advantages over the prior art. Each inherently can be a batch process, thereby increasing manufacturing throughput. In addition, each is able to coat large parts and complex surfaces without target manipulation, thereby reducing the complexity of manufacture. Each is also inherently is a low temperature process, so that the process does not distort or modify the dimensions of the workpiece or of dies used with the workpiece. Each also is able to produce a substrate for deposition of coatings with a high adherence, without the sputter of other known methods.

Experiments have been performed with the PIII process for components used in the automotive industry, but these applications have utilized relatively simple gaseous ions (C, N) for plasma source implantation with high voltage pulses. As described herein, the present invention extends the PIII process to plasma surface treatment processes focused on the specific requirements of non-critical, high value components such as golf clubs and other recreational items. Accordingly, an object of the present invention is to use the PIII process to deposit Diamond-Like-Carbon (DLC) coatings on workpieces. It is another object to improve the durability and accuracy of golf clubs by depositing DLC coatings on the golf clubs and/or golf club heads.

DLC, also called tetrahedral amorphous carbon (ta-C), has been studied for many years using various deposition methods, most of which employ energetic ion species. The deposition methods have included ion beam deposition, filtered vacuum arc deposition, plasma beam deposition, and PIII/PSII. DLC has mechanical and tribological properties very close to those of diamond, including high hardness, low friction coefficient, and chemical inertness in most aggressive environments, and can be deposited with densities approaching that of diamond. Moreover, because DLC coatings can be produced at a relatively low temperature, DLC coatings can be used in applications where the article being coated cannot experience elevated temperatures.

Thus, the unique properties of DLC make it a very attractive material to use as a wear resistant coating, and DLC coatings have been applied in a conventional (i.e., non PIII) manner as wear-resistant coatings for engine piston rings, tool coating, biomaterials, and the like. The present invention, however, uses the PIII process such as the one described above to deposit a DLC coating on a workpiece, including workpieces comprising sporting equipment, such as golf clubs and golf club heads.

Technically, there are two major advantages of a DLC process for workpieces such as golf clubs. A first advantage is the surface hardness and scratch resistance of DLC coatings. According to one of the top three golf clubs manufacturers in the U.S., scratching is the number one reason for returns of new golf clubs. A DLC coating has scratch resistance higher than virtually any other known process, having a hardness of up to about 80 Gpa.

A second advantage is that a DLC coating is extremely slick, with a very low coefficient of friction between 0.05 and 0.1 in air. To a golfer, this slickness has the potential to reduce hooks and slices, since the sidespin placed on the ball at impact may be reduced. Even a small improvement in this area would be a significant performance advantage to the average golfer.

A third advantage is the retention of surface features (e.g., grooves) over extended use, reducing or eliminating erosion and/or wear of these features due to abrasion resulting from impact of the golf ball and interceding objects, e.g., sand, direct, etc. This provides the benefit of retention of original (like-new) performance over extended use of the golf club.

Figure 5:
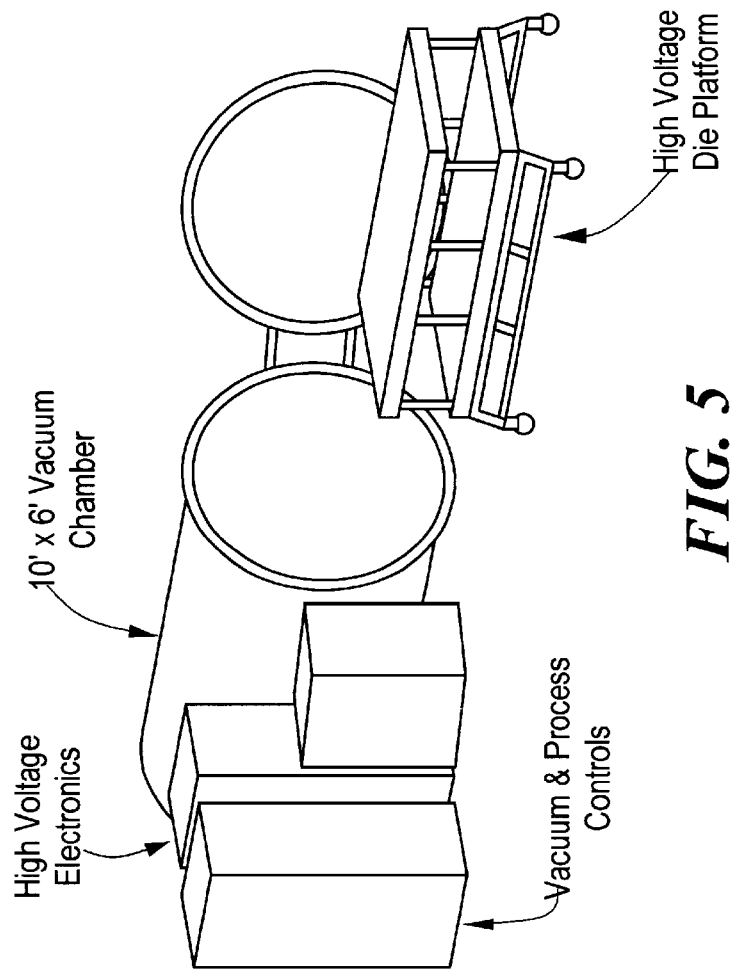
FIG. 5 is an illustration of another system for hardening a workpiece, in accordance with the invention.

FIG. 5 illustrates still another system for performing the PIII process on a workpiece, in accordance with one embodiment of the invention. The system of FIG. 5 consists of a 20 kV solid state pulse modulator, a 30 kW power supply, a 10' by 6' diameter vacuum chamber, and associated vacuum and control equipment.

As discussed above, for PIII processing, a relatively high voltage pulsed power is required. This can be achieved, in accordance with one embodiment of the invention, by using high voltage DC power supplies feeding a solid state modulator that switches the voltage into the workpiece, such as the modulators described in commonly assigned U.S. Pat. No. 5,444,610. The assignee of this invention also has developed other usable high voltage, high power switching supplies and solid state modulators. These additional power supplies and modulators feature state of the art IGBT switches in series and parallel configurations that allow nearly arbitrary high voltages (0.5 kV–200 kV) and currents (10 A–5 kA) to be reached.

For PIII processing, the three primary parameters involved in the design of these components are (1) average power, (2) peak voltage, and (3) peak current. PIII processing can be performed at 20 kV for DLC coating of lightweight alloys, 60 kV for N-implantation into steels, and up to 100 kV for H13 and other implantations.

It is expected that other industries can benefit from the application of the PIII processes that are described in connection with this invention. On direct benefit from this invention will be the development and commercialization of PIII processes that directly improve the productivity and competitiveness of the U.S. metalcasting industry. As a result of this increased productivity, the metalcasting industry may be able to expand into new markets, as well as to reclaim markets that had previously been lost to competitive technologies and/or countries.

Second, the processes, articles, and systems developed as part of this invention have the potential to impact areas outside of recreational markets. Harder, longer lasting metal surface treatments, especially those tolerant of wide temperature variance and chemical processes, have numerous applications in machine tooling, stamping and high wear metal products. These applications extend throughout the industrial regime, particularly in the automotive, aerospace, and manufacturing arenas. This invention may also be of benefit to other recreational products, such as skis, bats, tennis rackets, and similar products subject to abrasion or wear.

Finally, this invention builds upon and reinforces the PIII technologies currently emerging into commercial applications. This broader market will farther speed the adoption of plasma implantation processes throughout U.S. industry.

Accordingly, in this invention, golf club heads and other sporting good articles are coated by the plasma vapor deposition, plasma immersion implantation, and plasma immersion ion processing methods to eliminate the special fixturing required with line of sight ion implantation methods. The method of this invention is cost effective since a large number of articles are coated at once. Moreover, the current level applied to the articles is tailored depending on the number of articles present in the vacuum chamber to thus insure that each article is properly coated. At the same time, in this invention, since the cost of each article is function of the number of articles that can be coated at once, the number chosen is based on the cost of each stock piece before they are coated. A plurality of N non-industrial stock pieces are placed in a vacuum chamber where N is a function of the cost of each stock piece. A plasma is generated about the stock pieces and current is supplied to the stock pieces at a level tailored to effectively coat each of the plurality of N stock pieces with ions from the plasma. The current level depends on and is proportional to the number N of articles in the vacuum chamber.

In one embodiment, 100 golf club heads are placed in a vacuum chamber and the current level chosen is greater than 40 amps, for example 500 amps. In another example, 1,000 golf club heads are placed in the vacuum chamber and the current level chosen is greater than 80 amps, for example 1,000 amps. The plasma introduced into the vacuum chamber may be ionized gas, either nitrogen or methane. Plasma immersion implantation, plasma vapor deposition, or plasma immersion ion processing techniques may be used in accordance with the subject invention. In the preferred embodiment, the coating is a diamond-like-carbon coating.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A method for coating an article, the method comprising:

placing a plurality of N stock pieces into a vacuum chamber;

generating a plasma of energetic ions around the plurality of N stock pieces using a pulsed RF power; and supplying a pulsed current to the stock pieces at a level to sufficiently coat each of the plurality of N stock pieces with the ions from the plasma, wherein the level of the pulsed current depends on the number N of stock pieces, wherein the pulsed RF power and the pulsed current are synchronized with each other.

2. The method of claim 1 in which the plasma includes an ionized gas selected from the group of nitrogen and methane.

3. The method of claim 1 in which generating the plasma of the energetic ions includes at least one process selected from the group of plasma immersion implantation, plasma vapor deposition, and plasma immersion ion deposition.

4. The method of claim 1 in which the plurality of stock pieces are coated with a diamond-like carbon coating.

5. The method of claim 1 in which the plurality of stock pieces are sporting goods articles.

6. The method of claim 5 in which the sporting goods articles are golf club heads.

* * * * *